(12) United States Patent
Reed et al.

(10) Patent No.: US 11,530,620 B2
(45) Date of Patent: Dec. 20, 2022

(54) OVERSPEED PROTECTION FOR A MOTOR OF A GATE CROSSING MECHANISM

(71) Applicant: Siemens Mobility, Inc., New York, NY (US)

(72) Inventors: Quinton Reed, Oil City, PA (US); Daniel Spencer, Pittsburgh, PA (US)

(73) Assignee: Siemens Mobility, Inc., New York, NY (US)

( * ) Notice: Subject to any disclaimer, the term of this patent is extended or adjusted under 35 U.S.C. 154(b) by 401 days.

(21) Appl. No.: 16/799,892

(22) Filed: Feb. 25, 2020

(65) Prior Publication Data
US 2021/0262360 A1    Aug. 26, 2021

(51) Int. Cl.
| | | |
|---|---|---|
| *H02H 5/04* | (2006.01) | |
| *F01D 21/02* | (2006.01) | |
| *H02K 11/26* | (2016.01) | |
| *F01D 21/00* | (2006.01) | |
| *H01L 29/866* | (2006.01) | |
| *H02P 3/18* | (2006.01) | |
| *H02P 29/10* | (2016.01) | |

(52) U.S. Cl.
CPC .......... *F01D 21/02* (2013.01); *F01D 21/003* (2013.01); *H01L 29/866* (2013.01); *H02K 11/26* (2016.01); *H02P 3/18* (2013.01); *H02P 29/10* (2016.02)

(58) Field of Classification Search
CPC . H02K 11/26; H02P 29/10; H02P 3/18; H02P 25/03; H02P 29/0241; H01L 29/866
See application file for complete search history.

(56) References Cited

U.S. PATENT DOCUMENTS 3,761,792 A    9/1973  Whitney et al.
6,025,685 A  *  2/2000  Parsadayan ........... E05F 15/627
                                                         318/471

FOREIGN PATENT DOCUMENTS

EP          0594907 A1    4/1994
JP       2002027771 A  *  1/2002

* cited by examiner

*Primary Examiner* — Karen Masih

(57) ABSTRACT

Examples described herein provide a method for overspeed protection of a motor of a gate crossing mechanism. The method includes monitoring, by an overspeed protection circuit, a voltage across a first Zener diode and a second Zener diode. An anode of the first Zener diode is connected to an anode of the second Zener diode. The method further includes, responsive to determining that a Zener voltage threshold is exceeded, allowing a current to flow into a gate pin of a triac. The triac controls the motor of the gate crossing mechanism.

14 Claims, 5 Drawing Sheets

OVERSPEED PROTECTION FOR A MOTOR OF A GATE CROSSING MECHANISM

BACKGROUND

The present invention generally relates to a gate crossing mechanism, and more specifically, to techniques for overspeed protection for a motor of a gate crossing mechanism An intersection where a railway line crosses a road or path is referred to as a level crossing. Level crossings utilize gate crossing mechanisms to control traffic on the road or path when a train or other vehicle is passing through the level crossing. The gate crossing mechanisms prevent vehicles, pedestrians, etc., from crossing the railway line while the gate crossing mechanism is engaged.

SUMMARY

Embodiments of the present invention are directed to overspeed protection for a motor of a gate crossing mechanism.

A non-limiting example method includes monitoring, by an overspeed protection circuit, a voltage across a first Zener diode and a second Zener diode. An anode of the first Zener diode is connected to an anode of the second Zener diode. The method further includes, responsive to determining that a Zener voltage threshold is exceeded, allowing a current to flow into a gate pin of a triac. The triac controls the motor of the gate crossing mechanism.

A non-limiting example gate crossing mechanism includes a motor having a first phase, a second phase, and a third phase. The gate crossing mechanism further includes a controller having a first overspeed controller associated with the first phase of the motor and the second phase of the motor, a second overspeed controller associated with the second phase of the motor and the third phase of the motor, and a third overspeed controller associated with the third phase of the motor and the first phase of the motor. Each of the first, second, and third overspeed controllers include a pair of Zener diodes in an anode-to-anode configuration. Each of the first, second, and third overspeed controllers is configured to monitor a voltage across their respective pair of Zener diodes to determine whether a Zener voltage threshold is exceeded, and, responsive to determining that the Zener voltage threshold is exceeded, allow a current to flow into a gate pin of a triac, wherein the triac controls the motor of the gate crossing mechanism.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
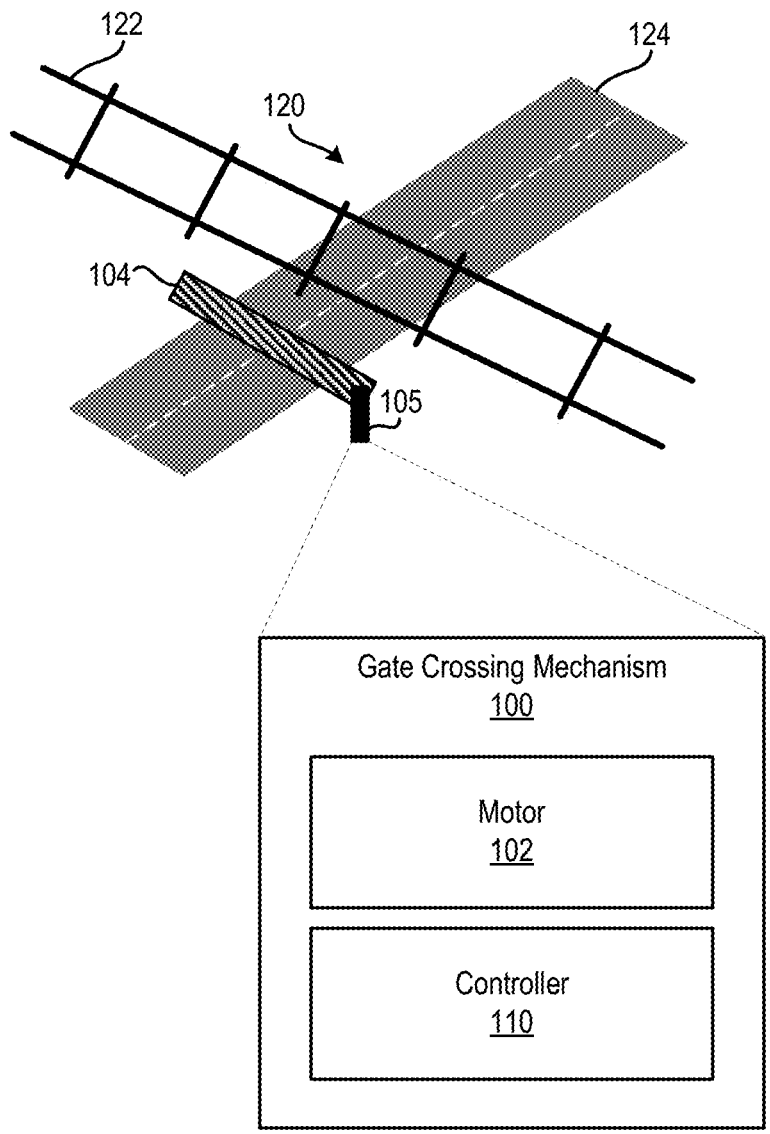
FIG. 1 depicts a block diagram of a processing system for a block diagram of a controller for a motor of a gate crossing mechanism according to one or more embodiments described herein.

The diagrams depicted herein are illustrative. There can be many variations to the diagram or the operations described therein without departing from the scope of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide for a gate crossing mechanism, including techniques for controlling a gate crossing motor and/or detecting and/or preventing faults of the gate crossing motor. A gate crossing mechanism protects motorists, pedestrians, and the like from oncoming trains by blocking level crossings or points at which public or private roads cross railway lines at the same level.

As one example, a gate crossing mechanism can include an arm or "gate" that, using a motor, selectively lowers/raises depending upon whether a train or other vehicle is passing through the level crossing. For example, if a train is approaching a level crossing, a gate can be lowered to prevent traffic on the road or path from crossing the railway line. A level crossing can be equipped with multiple gate crossing mechanisms. For example, each side of the railway line can include a gate crossing mechanism. In larger intersections, each side of the railway line can include two (or more) gate crossing mechanisms. Gate crossing mechanisms can further include lights, sirens, bells, or other similar devices that can provide visual and/or aural warnings.

Conventional gate crossing mechanisms can be susceptible to failures, malfunctions, etc., which can reduce their ability to control a level crossing safely. It is therefore desirable to improve efficiency, reliability, and functionality of conventional gate crossing mechanisms.

The above-described aspects of the invention address the shortcomings of the prior art by providing techniques for improving the efficiency, reliability, and functionality of gate crossing mechanisms. Such aspects can include fault detection of a gate crossing motor, overspeed protection of a gate crossing motor, direction control of a gate crossing motor, and thermal lockout of a gate crossing motor.

Gate crossing mechanisms having the features and functionality described herein provide improve efficiency and address problems associated with conventional gate crossing mechanisms. For example, a gate crossing mechanism can include a brushless motor and digital control logic rather than a conventional brushed motor and mechanical cams. Motor brushes can experience uneven wear patterns, after which they must be replaced. This is both costly and time consuming for railways or those responsible for maintaining gate crossing mechanisms featuring brushed motors. Moreover, whereas conventional gate crossing mechanisms having brushed motors required eight cams, the brushless motors of the gate crossing mechanisms described herein can use substantially less than eight cams (e.g., two cams).

Additionally, the brushless motors of the gate crossing mechanisms described herein provide expanded fault detection such as overcurrent and overtemperature detection, which can be determined from measured three-phase motor currents. This active fault detection serves to increase the availability of the gate crossing mechanism. The brushless motors of the gate crossing mechanisms described herein also provide an improved user interface to give maintainers clear feedback on gate configuration. This improves efficiency and accuracy for maintainers to set gate attributes in the field, thereby decreasing human error. Finally, the brushless motors of the gate crossing mechanisms described herein support a configurable gate which can function as either an entrance or an exit gate, which can depend for example on the FPGA firmware. This is a stark difference from the conventional gate crossing mechanisms, which can only function as an entrance gate unless an additional logic card is attached.

Turning now to FIG. 1, a block diagram of a controller 110 for a motor 102 of a gate crossing mechanism 100 is depicted according to one or more embodiments described herein. In this example, the gate crossing mechanism 100 includes the motor 102, the controller 110, and a gate 104. The gate 104 can be supported by any suitable structure, such as a gate support 105. The controller 110 and/or the motor 102 can be coupled to, incorporated in, or otherwise associated with the gate 104 and/or the gate support 105. The gate crossing mechanism 100 controls the gate 104 at a crossing 120 of a railway 122 and a road 124. The gate 104, when in a "down" or "closed" position, prevents traffic traveling along the road 124 from crossing the intersection 120. In examples, the intersection can be controlled by additional gate crossing mechanisms (not shown).

In some error states or fault conditions, the motor 102 can spin too fast. This is referred to as "overspeed." In some examples, the motor 102 can freewheel or move too fast, which can be caused by an overload on the gate 104 that can cause it to come down faster than desirable under a no power condition.

The present techniques prevent overspeed of the motor 102 (i.e., prevent the motor 102 from spinning too fast) by using the voltage generated from the motor 102 to trigger a restricting snub circuit (referred to herein as a "motor snubber" or "motor snubber circuit"). If the motor 102 generates too much voltage (i.e., an amount of voltage over a threshold), then the motor snubber circuit is triggered and slows down the motor 102. To do this, a low-value breaking resistor is implemented across each of the phases/terminals of the motor, effectively slowing down the motor 102. This technique is unique to brushless motors, like the motor 102, in that it filters out the back electromotive force (EMF) so that the drive voltage does not trigger the circuit.

Figure 2:
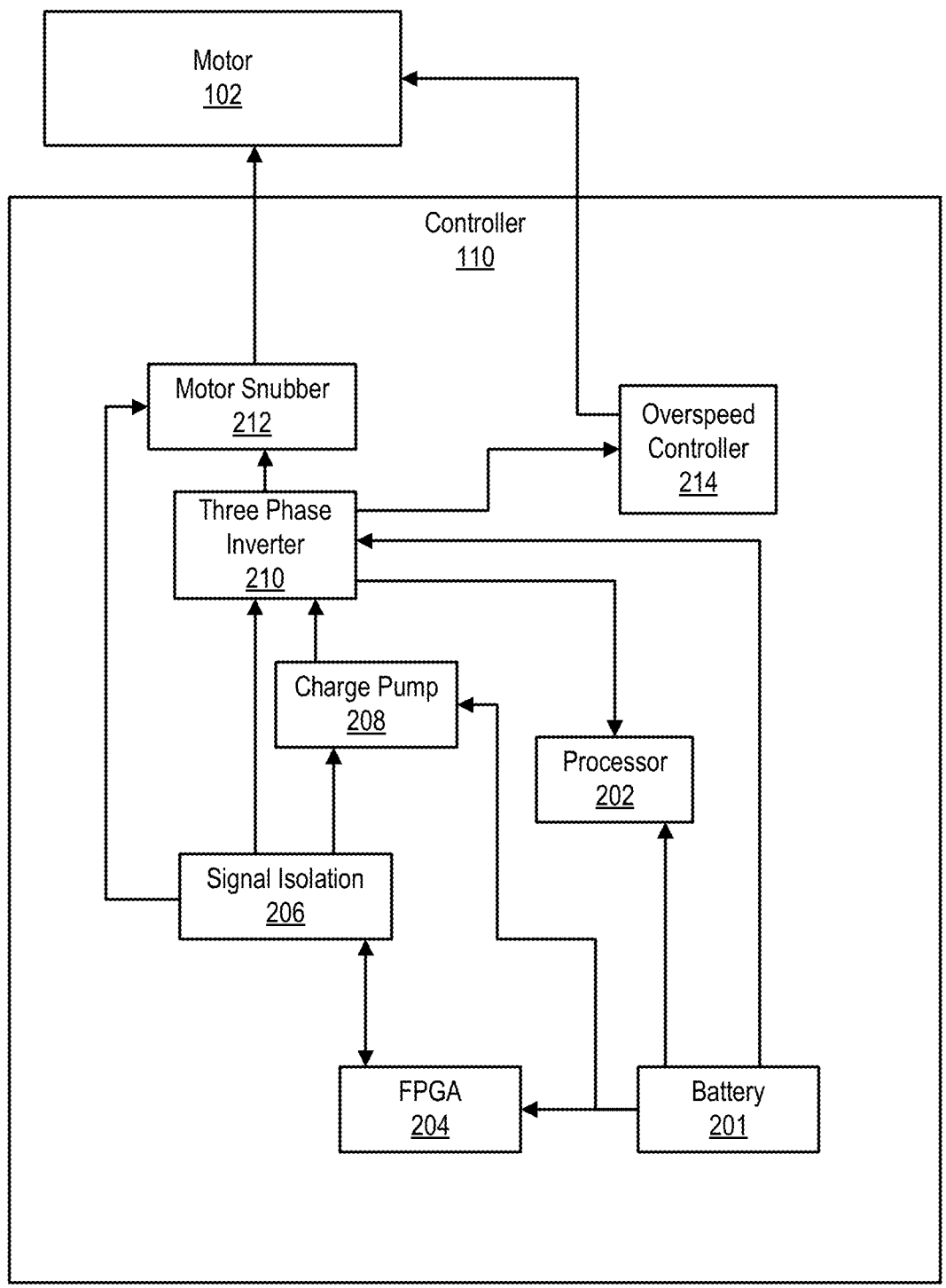
FIG. 2 depicts a block diagram of the controller of FIG. 1 being configured for overspeed protection for the motor of FIG. 1 according to one or more embodiments described herein.

FIG. 2 depicts a block diagram of the controller 110 of FIG. 1 being configured for overspeed protection for the motor 102 of FIG. 1 according to one or more embodiments described herein. According to one or more embodiments described herein, the controller 110 can include various components configured and arranged as shown.

As one example, the controller 110 includes a processor 202, a field-programmable gate array (FPGA) 204, a signal isolation block 206, a charge pump 208, a three-phase inverter 210, a motor snubber 212, and an overspeed controller 214. In a three-phase motor, such as the motor 102, three current sense resistors are utilized. However, more or fewer sense resistors can be utilized in other examples. In some examples, the processor 202 includes an analog-to-digital converter (ADC). As shown in FIG. 2, one or more of the processor 202, the FPGA 204, the charge pump 208, and/or the three-phase inverter 210 can be powered by a battery 201, although any suitable power source can be used. The three-phase inverter 210 drives the motor 102 via the motor snubber 212 and the overspeed controller 214.

Figure 3:
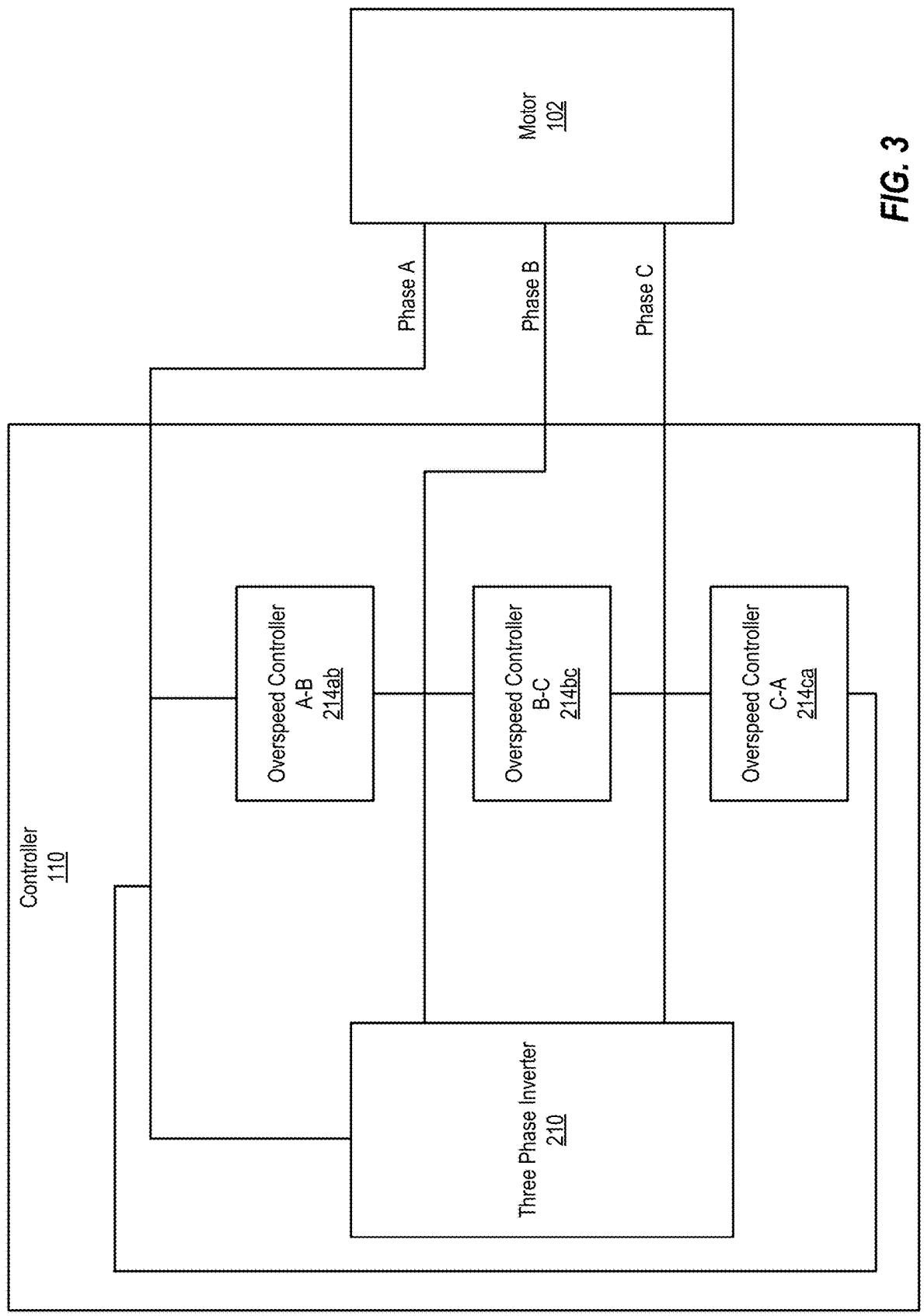
FIG. 3 depicts a block diagram of the controller of FIG. 1 being configured for overspeed protection for the motor of FIG. 1 according to one or more embodiments described herein.

FIG. 3 depicts a block diagram of the controller 110 of FIG. 1 being configured for overspeed protection for the motor 102 of FIG. 1 according to one or more embodiments described herein. In this example, the overspeed controller 214 of FIG. 2 is shown as three separate overspeed controllers: overspeed controller A-B 214*ab*, overspeed controller B-C 214*bc*, and overspeed controller C-A 214*ca* (collectively "overspeed controller 214"). Each of the overspeed controllers of FIG. 3 provide overspeed control and protection between two phases of the three-phase motor 102. For example, the overspeed controller A-B 214*ab* provides overspeed control and protection between phases A and B. Similarly, the overspeed controller B-C 214*bc* provides overspeed control provides overspeed control and protection between phases B and C while the overspeed controller C-A 214*ca* provides control and protection between phases C and A.

Figure 4:
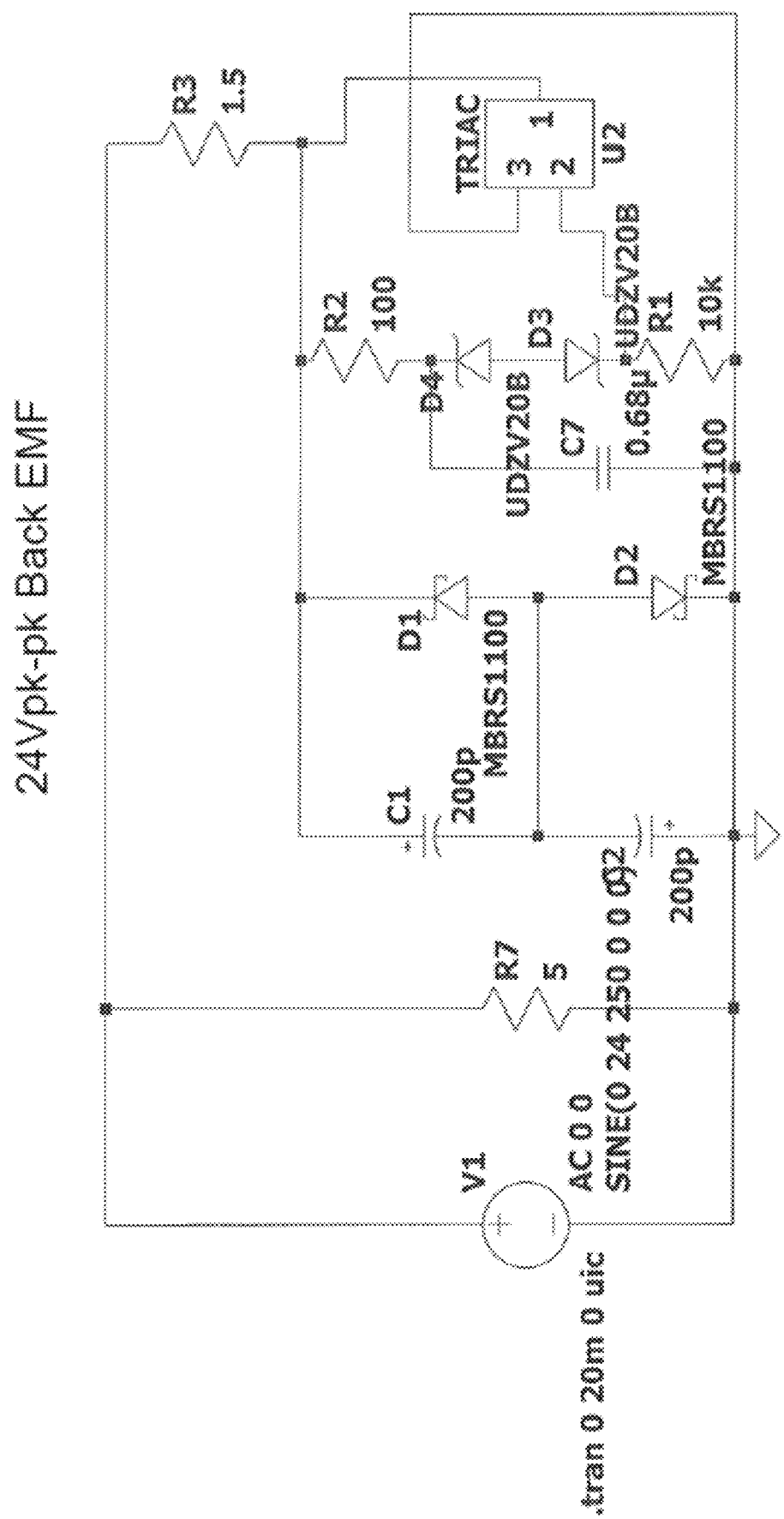
FIG. 4 depicts an overspeed protection circuit according to one or more embodiments described herein.

Each of the overspeed controllers 214 utilizes an overspeed protection circuit 400 as shown in FIG. 4. In particular, FIG. 4 depicts an overspeed protection circuit 400 according to one or more embodiments described herein. In the example of FIG. 4, the overspeed protection circuit 400 is a 24V peak-to-peak back EMF circuit. The overspeed protection circuit 400 uses a triode for alternating current (triac) U2 to control the speed and direction of the motor 102.

The overspeed protection circuit 400 is connected between the phases of the motor 102 (see FIG. 3) at the motor connector end after the motor snubber 212. When the motor 102 is spinning, it creates a voltage potential between any of the two phases. The faster the motor 102 spins, the larger the voltage. Two Zener diodes D3, D4 are used in the overspeed protection circuit 400, and each of the Zener diodes D3, D4 has an associated Zener voltage threshold. When the Zener voltage threshold is met, the Zener diode conducts and allows current to flow into the triac gate. The Zener diodes D3, D4 are configured in an anode to anode configuration (i.e., the anode terminal of D3 is connected to the anode terminal of D4) and are connected across the terminals of two phases of the motor 102. If the voltage from voltage source V1 rises above a Zener voltage threshold for the Zener diodes D3, D4, then the Zener diodes D3, D4 conduct and allow current to flow into a gate pin 2 of the triac U2. If the voltage from the voltage source V1 is not above the Zener voltage threshold, the Zener diodes D3, D4 do not conduct and thus deny current from flowing into the gate pin 2 of the triac U2. Once the triac U2 is triggered, the triac U2 will continue to conduct until the next zero crossing (i.e., no current). In the example of FIG. 4, the Zener voltage threshold is 24 volts, although, in other examples, this voltage can be other than 24 volts.

A large value power resistor R3 is placed between pin 1 of the triac and one of the phases to dissipate the energy from the motor 102 and provide the braking effect. Due to the voltage generation from a brushless motor (e.g., the motor 102) being alternating current (AC), the overspeed protection circuit 400 works as a secondary speed regulator for the motor 102 and turns off every time the back EMF reaches zero (i.e., when the voltage across the Zener diodes D3, D4). If there is not enough back EMF, then the circuit created by the Zener diodes D3, D4 will not turn on. This allows the overspeed voltage to be set close to the voltage generated during a loss of power fall and regulates any speed above that speed. This is much more effective than the DC motor solution because once the DC motor trips the circuit, it stayed on until the motor came to a stop. This could result in an excessively slow descent even though the circuit was barely tripped. According to one or more embodiments described herein, the overspeed protection circuit is made passive by filtering and only allowing the back EMF generated to trigger the braking resistor (e.g., the resistor R3). This creates a passive circuit which is always present and can engage if the motor 102 is spinning too fast upwards, downwards, with power, and without power.

Figure 5:
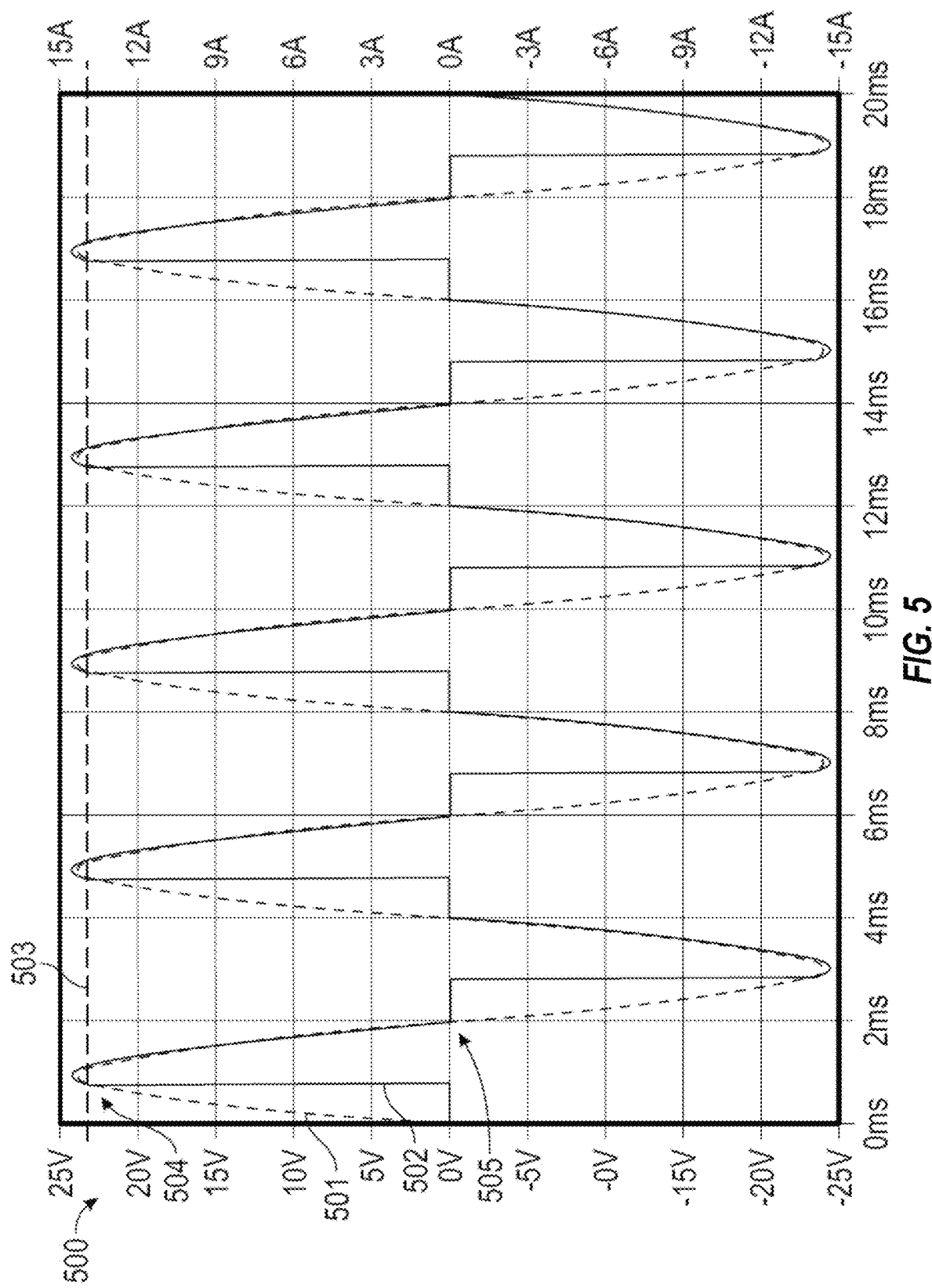
FIG. 5 depicts a graph of the voltage (of the voltage source V1) and the current (through the resistor R3) of the overspeed protection circuit of FIG. 4 according to one or more embodiments described herein.

The effectiveness of the overspeed protection circuit 400 is depicted in graph 500 of FIG. 5 according to one or more embodiments described herein. In particular, voltage 501 of the voltage source V1 and the current 502 through the resistor R3 of FIG. 4 is plotted over time. As can be seen, once the Zener voltage threshold 503 is reached, which in the example of FIGS. 4 and 5 is 24 volts, the Zener diodes D3, D4 enable current to flow to the triac U2 (see arrow 504). Once the voltage drops to 0 volts, the Zener diodes D3, D4 no longer enable (i.e., deny) current to flow to the triac U2 (see arrow 505).

With continued reference to the overspeed protection circuit 400 of FIG. 4, a low-pass filter is also provided according to one or more embodiments described herein. In particular, the resistor R3 along with the resistor R2 and the capacitor C7 form the low-pass filter on the triac U2 trigger pin. In some examples, the voltage source V1 of FIG. 4 can be a DC source. For example, if the voltage source V1 of FIG. 4 is a 24 volt DC battery (e.g., the battery 201) operating at an 80% duty cycle, it would produce a PWM. The low-pass filter filters out pulse-width-modulation (PWM) as it comes through. Thus, the PWM passes through C7 and does not have the opportunity to trigger the triac U2 whereas the back EMF (generated by the motor 102) has a low frequency and has enough time to charge the capacitor C7 and present a voltage at the anode of the Zener diode D4. If that voltage is high enough (i.e., at or above the Zener voltage threshold, the current is allowed to flow and the triac U2 is triggered. This provides passive protection and control across the phase at all times according to one or more embodiments described herein. For example, when the motor 102 is being actively driven, the low-pass filter should not trigger. However, when the motor 102 is not being actively driven, if the motor is in a freewheeling condition, the low-pass filter triggers and provides speed control to slow down the motor 102.

The embodiments described herein may be implemented as one or more systems, methods, and/or computer program products at any possible technical detail level of integration. The computer program product may include a computer readable storage medium (or media) having computer readable program instructions thereon for causing a processor to carry out aspects of the present invention.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for overspeed protection of a motor of a gate crossing mechanism, the method comprising:
    associating a first overspeed protection circuit with a first phase of a motor and a second phase of the motor,
    associating a second overspeed protection circuit with the second phase of the motor and a third phase of the motor, and
    associating a third overspeed protection circuit with the third phase of the motor and the first phase of the motor,
    monitoring, by the first overspeed protection circuit, a voltage across a first Zener diode and a second Zener diode, an anode of the first Zener diode being connected to an anode of the second Zener diode;
    monitoring, by the second overspeed protection circuit, a voltage across a third Zener diode and a fourth Zener diode, an anode of the third Zener diode being connected to an anode of the fourth Zener diode;
    monitoring, by the third overspeed protection circuit, a voltage across a fifth Zener diode and a sixth Zener diode, an anode of the fifth Zener diode being connected to an anode of the sixth Zener diode; and
    responsive to determining that a Zener voltage threshold is exceeded, allowing a current to flow into a gate pin of a triac, wherein the triac controls the motor of the gate crossing mechanism.

2. The method of claim 1, further comprising:
    responsive to determining that the Zener voltage threshold is not exceeded, denying the current to flow into the gate pin of the triac.

3. The method of claim 1, further comprising:
    responsive to determining that the Zener voltage threshold is exceeded, continuing to monitor the voltage across the first Zener diode and the second Zener diode.

4. The method of claim 3, further comprising:
    determining whether the voltage across the first Zener diode and the second Zener diode returns to zero.

5. The method of claim 4, further comprising:
    responsive to determining that the voltage across the first Zener diode and the second Zener diode returns to zero, denying the current to flow into the gate pin of the triac.

6. The method of claim 1, wherein the motor is a brushless motor.

7. The method of claim 1, wherein the motor is a three-phase motor.

8. A gate crossing mechanism comprising:
    a motor having a first phase, a second phase, and a third phase; and
    a controller comprising a first overspeed controller associated with the first phase of the motor and the second phase of the motor, a second overspeed controller associated with the second phase of the motor and the third phase of the motor, and a third overspeed controller associated with the third phase of the motor and the first phase of the motor,
    wherein each of the first, second, and third overspeed controllers comprise a pair of Zener diodes in an anode-to-anode configuration, and wherein each of the first, second, and third overspeed controllers is configured to:
        monitor a voltage across their respective pair of Zener diodes to determine whether a Zener voltage threshold is exceeded, and
        responsive to determining that the Zener voltage threshold is exceeded, allow a current to flow into a gate pin of a triac, wherein the triac controls the motor of the gate crossing mechanism.

9. The gate crossing mechanism of claim 8, wherein one or more of the first, second, and third overspeed controllers further comprise a low-pass filter.

10. The gate crossing mechanism of claim 8, wherein the motor is a brushless motor.

11. The gate crossing mechanism of claim 8, wherein one or more of the first, second, and third overspeed controllers is further configured to:
    responsive to determining that the Zener voltage threshold is not exceeded, deny the current to flow into the gate pin of the triac.

12. The gate crossing mechanism of claim 8, wherein one or more of the first, second, and third overspeed controllers is further configured to:
    responsive to determining that the Zener voltage threshold is exceeded, continue to monitor the voltage across the pair of Zener diodes.

13. The gate crossing mechanism of claim 12, wherein one or more of the first, second, and third overspeed controllers is further configured to:
    determine whether the voltage across the pair of Zener diodes returns to zero.

14. The gate crossing mechanism of claim 13, wherein one or more of the first, second, and third overspeed controllers is further configured to:
    responsive to determining that the voltage across the pair of Zener diodes returns to zero, deny the current to flow into the gate pin of the triac.

* * * * *